United States Patent
Tohoda et al.

(10) Patent No.: US 9,755,088 B2
(45) Date of Patent: Sep. 5, 2017

(54) SOLAR CELL MANUFACTURING METHOD

(71) Applicant: SANYO Electric Co., Ltd., Daito-shi, Osaka (JP)

(72) Inventors: Satoshi Tohoda, Osaka (JP); Kenta Ishimura, Osaka (JP); Yayoi Nakatsuka, Osaka (JP)

(73) Assignee: SANYO ELECTRIC CO., LTD., Osaka (JP)

( * ) Notice: Subject to any disclaimer, the term of this patent is extended or adjusted under 35 U.S.C. 154(b) by 0 days.

(21) Appl. No.: 14/623,854

(22) Filed: Feb. 17, 2015

(65) Prior Publication Data

US 2016/0043243 A1 Feb. 11, 2016

Related U.S. Application Data

(63) Continuation of application No. PCT/JP2012/072147, filed on Aug. 31, 2012.

(51) Int. Cl.
- *H01L 31/0224* (2006.01)
- *H01L 31/18* (2006.01)
- *H01B 1/22* (2006.01)
- *H01L 31/0747* (2012.01)

(52) U.S. Cl.
CPC ....... *H01L 31/022425* (2013.01); *H01B 1/22* (2013.01); *H01L 31/0747* (2013.01); *H01L 31/18* (2013.01); *Y02E 10/50* (2013.01)

(58) Field of Classification Search
CPC .......... H01L 31/022425; H01L 31/18
USPC ......................................................... 438/98
See application file for complete search history.

(56) References Cited

U.S. PATENT DOCUMENTS

| | | | |
|---|---|---|---|
| 2006/0082952 A1* | 4/2006 | Ogiwara | H01B 1/22 361/528 |
| 2008/0153973 A1* | 6/2008 | Ittel | C09D 11/10 524/555 |
| 2009/0243111 A1* | 10/2009 | Ishikawa | H01L 31/022425 257/762 |
| 2010/0059116 A1* | 3/2010 | Brenner | H01B 1/16 136/256 |
| 2010/0178432 A1* | 7/2010 | Kondo | C08J 7/123 427/535 |

(Continued)

FOREIGN PATENT DOCUMENTS

| | | |
|---|---|---|
| JP | 2008294366 A | 12/2008 |
| JP | 2010507913 A | 3/2010 |
| JP | 2010147194 A | 7/2010 |
| WO | 2008026415 A1 | 3/2008 |

OTHER PUBLICATIONS

International Preliminary Report on Patentability corresponding to Application No. PCT/JP2012/072147; Date of Mailing: Mar. 3, 2015, with English translation.

(Continued)

*Primary Examiner* — Christine Enad
(74) *Attorney, Agent, or Firm* — Cantor Colburn LLP

(57) ABSTRACT

In a method for manufacturing a solar cell, a first electrode is formed on one surface of a photoelectric conversion section by means of screen printing using a conductive paste, and a second electrode having an area larger than that of the first electrode is formed on the other surface of the photoelectric conversion section by means of screen printing using a conductive paste having viscosity lower than that of the conductive paste.

11 Claims, 5 Drawing Sheets

(56) References Cited

U.S. PATENT DOCUMENTS

| | | | | |
|---|---|---|---|---|
| 2010/0317147 | A1* | 12/2010 | Bettinelli | B41F 15/00 438/98 |
| 2011/0260115 | A1* | 10/2011 | Kim | B82Y 10/00 252/503 |
| 2011/0284050 | A1 | 11/2011 | Saita et al. | |
| 2013/0161572 | A1* | 6/2013 | Ittel | H01L 31/022425 252/514 |
| 2013/0213451 | A1* | 8/2013 | Nakauchi | H01L 31/022425 136/244 |
| 2013/0273687 | A1* | 10/2013 | Akimoto | H01L 31/022441 438/98 |
| 2014/0073083 | A1* | 3/2014 | Shima | H01L 31/022466 438/96 |
| 2014/0238476 | A1* | 8/2014 | Konishi | H01L 31/02167 136/255 |
| 2014/0318613 | A1* | 10/2014 | Von Campe | H01L 31/0201 136/256 |
| 2014/0329126 | A1* | 11/2014 | Ho | H01M 4/13 429/128 |
| 2014/0373909 | A1* | 12/2014 | Zhang | C07F 9/11 136/256 |

OTHER PUBLICATIONS

Notification Concerning Transmittal of International Preliminary Report on Patentability and Notification of Transmittal of Translation of the IPRP corresponding to Application No. PCT/JP2012/072147; Date of Mailing: Mar. 12, 2015.

Second and Supplementary Notice Informing the Applicant of the Communication of the International Application corresponding to Application No. PCT/JP2012/072147; Date of Mailing: Dec. 31, 2014.

Written Opinion of the International Searching Authority corresponding to Application No. PCT/JP2012/072147; Date of Mailing: Sep. 25, 2012.

International Search Report corresponding to Application No. PCT/JP2010/072147; Date of Mailing: Sep. 25, 2012, with English translation.

Written Opinion corresponding to Application No. PCT/JP2010/072147; Date of Mailing: Sep. 25, 2012; no English translation available.

Japanese Office Action corresponding to Application No. 2014-532677; Date of Mailing: Aug. 9, 2016.

Japanese Office Action corresponding to Application No. 2014-532677; Issued: Oct. 11, 2016.

* cited by examiner

SOLAR CELL MANUFACTURING METHOD

This application is a continuation under 35 U.S.C. §120 of PCT/JP2012/072147, filed Aug. 31, 2012, which is incorporated herein by reference.

TECHNICAL FIELD

The present invention relates to a manufacturing method of a solar cell.

BACKGROUND ART

A solar cell comprises a light-receiving surface electrode formed over alight receiving surface of a photoelectric conversion unit, and a back surface electrode formed over a back surface of the photoelectric conversion unit. The electrodes can be formed through screen printing of a conductive paste (for example, refer to Patent Document 1).

RELATED ART REFERENCE

Patent Document

[Patent Document 1] JP H11-103084 A

DISCLOSURE OF INVENTION

Technical Problem

The electrode formation method by screen printing still has room for improvement from the viewpoint of reliability or the like.

Solution to Problem

According to one aspect of the present invention, there is provided a method of manufacturing a solar cell, comprising: forming a first electrode over one surface of a photoelectric conversion unit by screen printing of a first conductive paste, and forming a second electrode having a larger area than that of the first electrode over the other surface of the photoelectric conversion unit by screen printing of a second conductive paste having a lower viscosity than that of the first conductive paste.

Advantageous Effects of Invention

According to a method of manufacturing a solar cell of various aspects of the present invention, a target electrode structure can be formed through screen printing of conductive pastes.

BEST MODE FOR CARRYING OUT THE INVENTION

Figure 1:
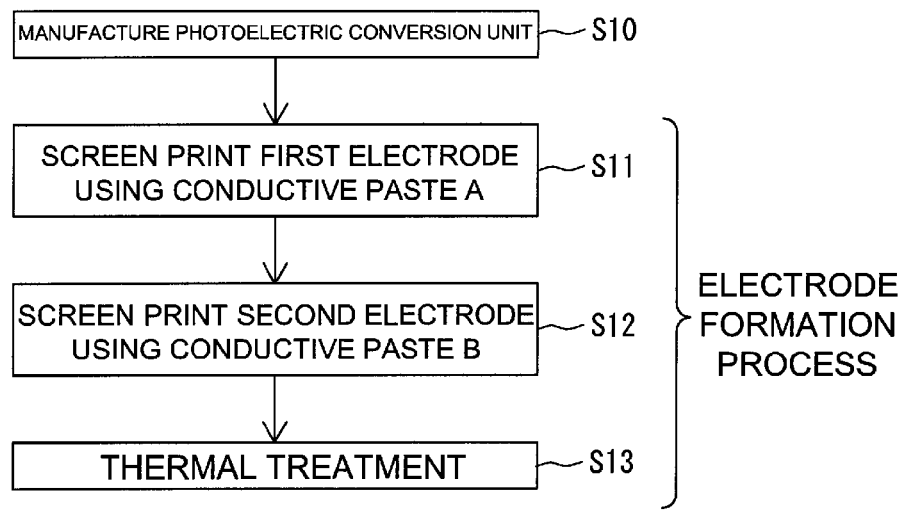
FIG. 1 is a flowchart showing a manufacturing process of a solar cell according to a preferred embodiment of the present invention.

A preferred embodiment of the present invention will now be described in detail with reference to the drawings. The present invention is not limited to the below-described preferred embodiment. In addition, the drawings referred to in the embodiment are schematically described, and the size and ratio of the constituent elements drawn in the drawings may differ from the actual structure. Specific size, ratio, or the like should be determined in consideration of the below description.

Figure 2:
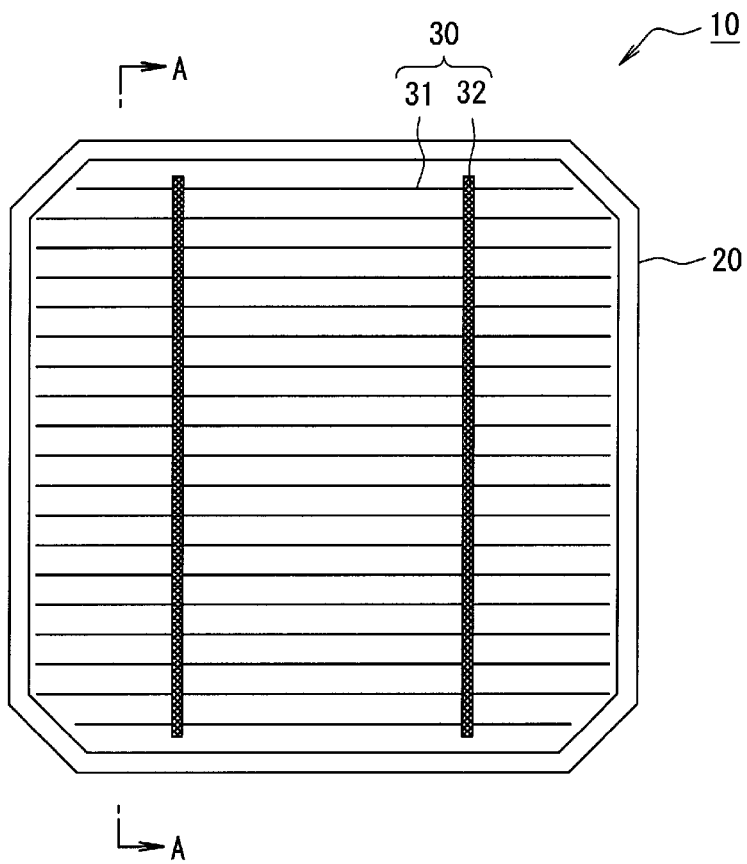
FIG. 2 is a diagram showing a solar cell according to a preferred embodiment of the present invention, viewed from the side of a light receiving surface.
Figure 3:
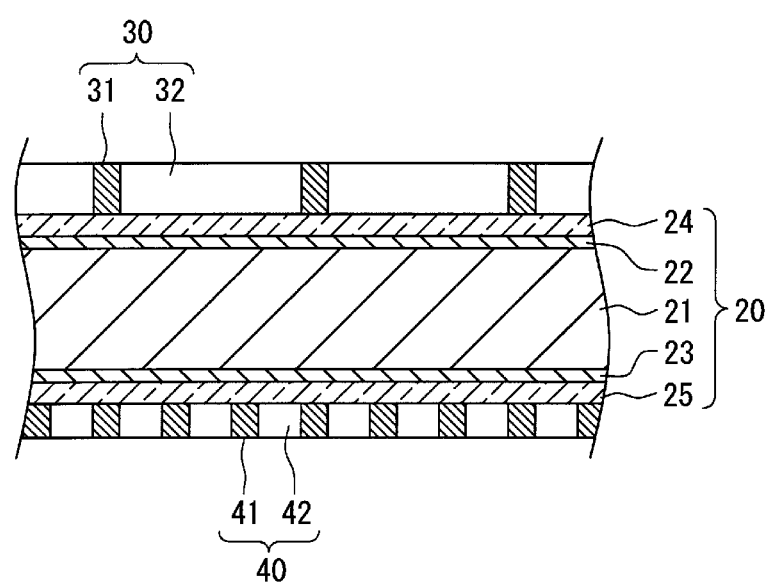
FIG. 3 is a diagram showing a part of a cross section along an A-A line in FIG. 1.

A manufacturing method of a solar cell 10 according to a preferred embodiment of the present invention will now be described with reference to FIGS. 1-6. FIG. 1 is a flowchart showing a manufacturing process of the solar cell (which hereinafter may also be referred to as "present process"). FIG. 2 is a plan view showing the solar cell 10 manufactured by the present process, viewed from the side of the light receiving surface, and FIG. 3 is a diagram showing a part of a cross section along an A-A line of FIG. 2.

In the manufacturing process of the solar cell 10, first, a photoelectric conversion unit 20 that produces carriers by receiving light is manufactured (S10). The photoelectric conversion unit 20 comprises a substrate 21 formed of a semiconductor material such as, for example, crystalline silicon (c-Si), gallium arsenide (GaAs), and indium phosphide (InP). In this process, over one surface of the substrate 21, an amorphous semiconductor layer 22 including, for example, an i-type amorphous silicon layer and a p-type amorphous silicon layer, and a transparent conductive layer 24 are sequentially formed, and over the other surface of the substrate 21, an amorphous semiconductor layer 23 including, for example, an i-type amorphous silicon layer and an n-type amorphous silicon layer, and a transparent conductive layer 25 are sequentially formed. These layers may be formed by placing a cleaned substrate 21 in a vacuum chamber, and applying CVD or sputtering.

In the present embodiment, one surface of the substrate 21 serves as a light receiving surface and the other surface of the substrate 21 serves as the back surface. The "light receiving surface" is the surface through which the solar light from the outside of the solar cell 10 is primarily incident, and refers to a surface having a smaller area of an electrode, that will be described later (that is, a smaller area covered by the electrode). Consequently, the "back surface" refers to a surface having a larger area of the electrode that will be described later.

For the formation of the i-type amorphous silicon layer by CVD, for example, a material gas in which silane ($SiH_4$) is diluted with hydrogen ($H_2$), is used. In the case of the p-type amorphous silicon layer, material gas in which diborane ($B_2H_6$) is added to silane, and the resulting gas is diluted with hydrogen ($H_2$), may be used. In the case of the n-type amorphous silicon layer, material gas in which phosphine ($PH_3$) is added to silane, and the resulting gas is diluted with hydrogen ($H_2$), may be used. The transparent conductive layers 24 and 25 are formed from, for example, a transparent conductive oxide in which a metal oxide such as indium oxide ($In_2O_3$) and zinc oxide (ZnO) is doped with tin (Sn), antimony (Sb), or the like.

In the process of S10, preferably, a texture structure is formed over both surfaces of the substrate 21 before the above-described layers are layered. The texture structure is a surface unevenness structure that inhibits surface reflection and increases an amount of light absorption of the photoelectric conversion unit 20, and may be formed, for example, by anisotropic etching of a (100)-plane of the substrate 21 using potassium hydroxide (KOH) etchant.

Then, a first electrode 30 serving as a light receiving surface electrode, and a second electrode 40 serving as a back surface electrode are formed over the photoelectric conversion unit 20 (S11~S13). With this process, the solar cell 10 is manufactured. More specifically, a pattern of a conductive paste A is printed over the light receiving surface of the photoelectric conversion unit 20 (S11), and a pattern of a conductive paste B is printed over the back surface of the photoelectric conversion unit 20 (S12). Then, the photoelectric conversion unit 20 over which the conductive pastes A and B are printed is thermally treated, to form the first electrode 30 and the second electrode 40 (hereinafter, these electrodes may be collectively referred to as "electrode") (S13). The order of processes of S11 and S12 may be opposite to that described above, and a step of a thermal treatment at a lower temperature than the process of S13 may be provided after the processes of S11 and S12.

In the present electrode formation process, as will be described in detail later, the electrodes are formed through screen printing of the conductive pastes. Different conductive pastes A and B are used in the printing process of the first electrode 30 and the printing process of the second electrode 40.

The conductive paste A contains a constituent material of the first electrode 30, and the conductive paste B contains a constituent material of the second electrode 40. Different types of the conductive paste include a thermal curing type which is solidified by heating at a temperature of less than or equal to 200° C., an ultraviolet curing type which is solidified by irradiation of an ultraviolet ray, a calcination type which is solidified by heating at approximately 400° C.~1000° C., etc. As the conductive pastes A and B, a thermal curing type paste containing a conductive filler, a binder resin, and an additive such as a solvent is preferable. The electrodes formed using the thermal curing type conductive pastes A and B have a structure in which the conductive filler is dispersed in the binder resin. The process of S13 is executed, for example, under conditions of 200° C. for 60 minutes, and the binder resin is cured in this process.

The conductive pastes A and B contain the conductive filler, the binder resin, and the additive such as the solvent. For the conductive filler, for example, metal particles such as silver (Ag), copper (Cu), and nickel (Ni), carbon, or a mixture thereof, is used. Of these, Ag particles are preferable. The binder resin is preferably a thermosetting resin. The binder resin which is not yet cured is in the form of a solid which can dissolve in the solvent or in the form of liquid or paste (semi-solid) at room temperature. For the binder resin, for example, a polyester-based resin, a phenol-based resin, a polyimide-based resin, a polycarbonate-based resin, a polysulfone-based resin, a melamine-based resin, or an epoxy-based resin, or a mixture thereof, is used. Of these, the phenol-based resin, the melamine-based resin, and the epoxy-based resin are preferable, and the epoxy-based resin is particularly preferable. The conductive pastes A and B may contain a curing agent corresponding to the binder resin as necessary. As the additive, in addition to the solvent, a rheology adjustment agent, a plasticizer, a dispersant, an antifoaming agent, or the like may be exemplified.

As the solvent, ether-based solvents such as ethylene glycol monoethyl ether (ethyl cellosolve), ethylene glycol monobutyl ether (butyl cellosolve), ethylene glycol monophenyl ether, diethylene glycol monobutyl ether (butyl carbitol), cellosolve acetate, butyl cellosolve acetate, carbitol acetate, and butyl carbitol acetate (hereinafter referred to as "BCA"), alcohol-based solvents such as hexanol, octanol, decanol, stearyl alcohol, ceryl alcohol, cyclohexanol, and terpineol, ketone-based solvents such as methyl ethyl ketone, methyl isobutyl ketone, and isophorone, ester-based solvents such as ethyl acetate and butyl acetate, or aromatic hydrocarbon-based solvents such as toluene, and xylene, or a mixture thereof, may be exemplified.

The first electrode 30 formed in the present electrode formation process includes a plurality of (for example, 40~60) finger sections 31, and a plurality of (for example, 2~4) bus bar sections 32. The finger section 31 is a narrow-line-shaped electrode formed over a wide range over the transparent conductive layer 24. The bus bar section 32 is an electrode that collects carriers from the finger section 31. In the first electrode 30, the bus bar sections 32 are placed parallel to each other with a predetermined spacing therebetween, and the plurality of finger sections 31 are placed orthogonal to the bus bar sections 32.

An electrode width of the finger section 31 is preferably about 20 μm~100 μm, and more preferably, about 30 μm~90 μm, from the viewpoint of reduction of shadow loss or the like. The finger section 31 may be formed in a tapered shape. For example, an electrode width at the narrow portion may be set to about 30 μm~50 μm, and an electrode width at the wider portion may be set to about 60 μm~90 μm. The electrode width of the bus bar section 32 is set, for example, wider than the electrode width of the finger section 31. Thicknesses of the finger section 31 and the bus bar section 32 is about 10 μm~80 μm, and preferably, about 20 μm~60 μm from the viewpoint of reduction of resistance loss or the like, and it is particularly preferable that the thicknesses are similar.

Similar to the first electrode 30, the second electrode 40 also includes a plurality of finger sections 41 and a plurality of bus bar sections 42. However, the second electrode 40 is formed in a larger area than the first electrode 30. The second electrode 40 has an electrode area of about 2 times~6 times the area of the first electrode 30, and more preferably, about 3 times~4 times the area of the first electrode 40. The second electrode 40 may have a wider electrode width than that of the first electrode 30, but preferably, from the viewpoint of reducing the resistance loss from a wide range of the photoelectric conversion unit 20, the number of the finger sections may be set larger than that of the finger section 31, and the wiring width may be set similar to that of the finger section 31. The number of the finger sections 41 is set to about 2 times~6 times the number of the finger sections 31, and more preferably, about 3 time~5 times (for example, 150~250) the number of the finger sections 31. The thickness of the second electrode 40 is preferably thinner than that of the first electrode 30 from the viewpoint of material cost reduction, prevention of warping of the substrate 21, or the like, and is, for example, about 5 μm~60 μm, and more preferably, about 10 μm~40 μm.

Figure 4:
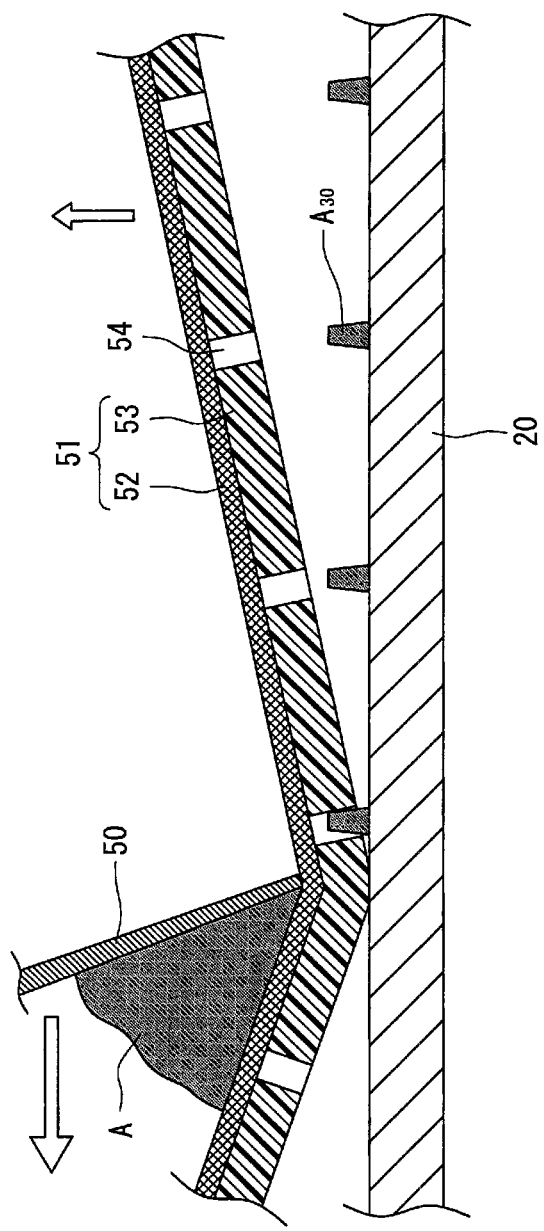
FIG. 4 is a diagram showing screen printing of a first conductive paste in the manufacturing process of the solar cell according to a preferred embodiment of the present invention.
Figure 5:
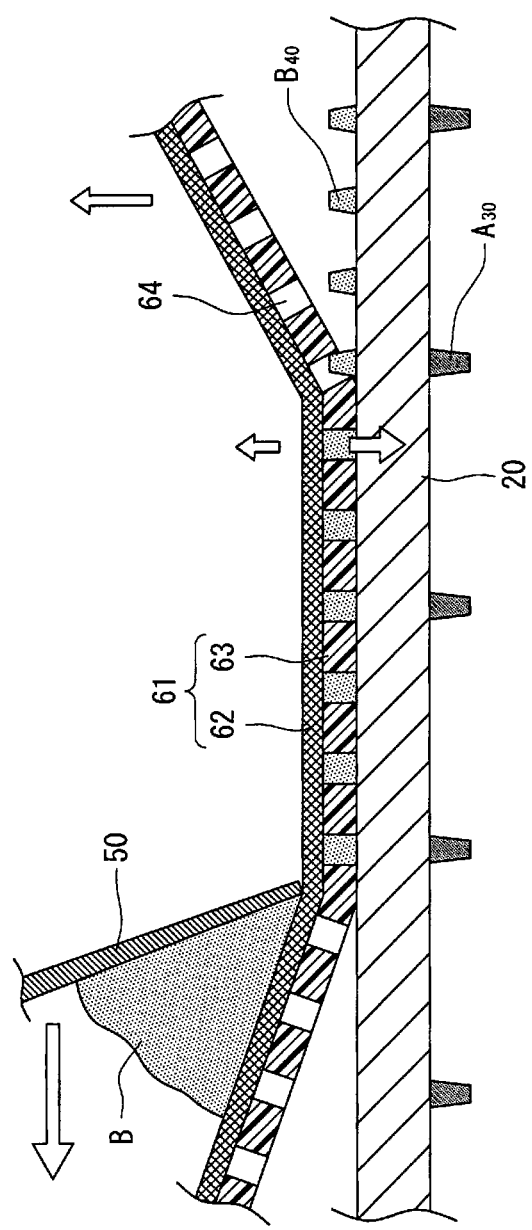
FIG. 5 is a diagram showing screen printing of a second conductive paste in the manufacturing process of the solar cell according to a preferred embodiment of the present invention.

A screen printing processes of S11 and S12 will now be described in detail with reference to FIGS. 4 and 5. FIG. 4 is a diagram showing a process of S11, and FIG. 5 is a diagram showing a process of S12. Descriptions common to S11 and S12 will be given with reference to S11. In the present embodiment, off-contact printing is described, but alternatively, on-contact printing may be applied.

In the process of S11, a squeezee 50 formed from an elastic structure having a solvent tolerance, and a screen plate 51 having an opening 54 corresponding to the shape of the first electrode 30 are used to transfer the conductive paste A to the light receiving surface of the photoelectric conversion unit 20.

The screen plate 51 has a mesh 52 which is a fiber or the like which allows the conductive paste A to pass through, and a frame (not shown) on which the mesh 52 is affixed. In the mesh 52, a mask member 53 is provided corresponding to a region over the light receiving surface in which the conductive paste A is not to be applied. With this configuration, on the screen plate 51, a pattern of the opening 54 corresponding respectively to the shapes of the finger section 31 and the bus bar section 32 is formed.

The mesh 52 is formed, for example, from a resin fiber such as polyester, and a metal wiring such as stainless steel. A wiring width of the mesh 52, a number of meshes, an opening percentage, or the like are suitably selected according to the wiring width, thickness, or the like of the electrode to be formed. For the mask member 53, normally, a photosensitive emulsion is used. The emulsion is selected according to a resolution, exposure sensitivity, or the like, and, for example, a diazo-based material or a stilbazolium-based material is used.

More specifically, the conductive paste A is placed over the screen plate 51 on which the opening 54 is formed only on a portion where the conductive paste A is to be transferred, the squeezee 50 is slid, to fill the conductive paste A to the opening 54, and the screen plate 51 is pressed against the light receiving surface. When the portion of the screen plate 51 where the squeezee 50 has passed is separated from the light receiving surface, so-called plate separation, the conductive paste A is discharged from the opening 54, and transferred to the light receiving surface. With this process, the conductive paste A is formed in the pattern of the first electrode 30 (hereinafter referred to as "conductive paste $A_{30}$"). The conductive paste $A_{30}$ contains solvent and the binder resin is in the state of not being cured, until the thermal treatment is applied in the process of S13.

In the screen printing process, parameters that determine the printing conditions include a squeezee angle, a squeezee speed, a squeezee pressure, a clearance which is a distance between the screen plate 51 and the photoelectric conversion unit 20, etc. These parameters can be set, for example, to similar values between the processes of S11 and S12.

In the process of S12, the conductive paste B is transferred to the back surface of the photoelectric conversion unit 20 using the squeezee 50, and a screen plate 61 having an opening 64 corresponding to the shape of the second electrode 40. With this process, the conductive paste B is formed in the pattern of the second electrode 40 (hereinafter referred to as "conductive paste $A_{40}$"). The conductive paste $B_{40}$ is formed thinner than the conductive paste $A_{30}$ and thus it is preferable to use, as the mesh 62 of the screen plate 61, a structure having a larger number of meshes and a lower opening percentage than the mesh 52. A mask member 63 of the screen plate 61 is preferably thinner than the mask member 53.

In the present electrode formation process, a conductive paste having a lower viscosity than the conductive paste A used in the process of S11 is used as the conductive paste B used in the process of S12. In addition, preferably, the viscosity of the conducive paste B is set to lower values in the viscosity range where the screen printing is possible (for example, 50~300 Pa·s at 10 rpm) as the electrode area of the second electrode 40 becomes larger. In other words, in the present electrode formation process, a conductive paste of a suitable viscosity corresponding to the electrode area is used. With this configuration, it is possible to inhibit disconnection of wiring which tends to occur when the second electrode 40 is formed in a large area.

When the conductive paste A has a viscosity of $\rho_A$ and the conductive paste B has a viscosity of $\rho_B$, $\rho_B$ is set at least about 10% lower than $\rho_A$. Preferably, $\rho_B$ is set lower than $\rho_A$ by 20% or more, and more preferably, $\rho_B$ is set about 20%~70% lower than $\rho_A$. As described above, it is preferable that, as the area of the second electrode 40 becomes larger and the number of openings 64 is increased (as the pitch of the opening 64 is narrowed) compared to the first electrode 30, $\rho_B$ is set smaller. In addition, preferably, $\rho_B$ is set smaller as the mesh 62 becomes finer. On the other hand, because the electrode width of the first electrode 30 must be narrowed, $\rho_A$ is adjusted to a viscosity at which the conductive paste A does not spread over the light receiving surface.

The content of conductive filler is about 85 weight %~95 weight % with respect to the total weights of the conductive pastes A and B, and is preferably about 90 weight %~93 weight %. The content of the binder resin is about 1 weight %~10 weight %, and is preferably about 2 weight %~7 weight %. The additive such as the solvent is added as necessary. The solvent depends on the type of the binder resin or the like, but is preferably contained in an amount of 1 weight % or more, and is particularly preferably contained in an amount of about 2 weight %~10 weight %.

The conductive pastes A and B differ from each other in at least one of the type or content of at least one of the conductive filler, the binder resin, and the additive. For example, a configuration may be employed in which the rheology adjustment agent is not added to the conductive paste B and is added only to the conductive paste A, to set $\rho_B < \rho_A$. Alternatively, the solvent and plasticizer may be added only to the conductive paste B, to achieve $\rho_B < \rho_A$.

Alternatively, as the conductive filler, a conductive filler including a flake-form filler and a spherical filler may be used. The flake-form filler is a filler having an aspect ratio (major axis length/minor axis length) of the filler observed by, for example, a scanning electron microscope (SEM) of greater than or equal to 1.5, and a spherical filler is a filler having an aspect ratio of less than 1.5. For example, in the conductive pastes A and B, the ratio of the flake-form filler and the spherical filler may be changed to achieve $\rho_B < \rho_A$.

As a first preferable method of setting $\rho_B < \rho_A$, a method may be exemplified in which the content of the solvent of the conductive paste B is set higher than the content of the solvent of the conductive paste A. The same solvent may be used for the conductive pastes A and B. As this method merely changes the amount of solvent between the conductive pastes A and B, the work involved in adjusting the viscosity is simple. In addition, with this method, the constituent materials of the first electrode 30 and the second electrode 40 become the same, and, for example, quality control may be easily realized.

The solvent is suitably selected according to the type of the binder resin, the printing conditions, etc. As one preferable solvent, BCA may be exemplified. For example, when the binder resin is an epoxy-based resin and the solvent is BCA, the conductive paste A contains BCA in an amount of about 5% and the conductive paste B contains BCA in an amount of about 6%.

As a second preferable method of realizing $\rho_B<\rho_A$, a method may be exemplified in which different types of solvents are used between the conductive pastes A and B. For the binder resin, the same binder resin may be used for the conductive pastes A and B. When the binder resin is the same, it is preferable to use, for the conductive paste B, a solvent that tends to more easily dissolve the binder resin than the case of the conductive paste A. For example, in the conductive paste B, a solvent having a solubility parameter (SP value) closer to the SP value of the binder resin than the conductive paste A is used. With this method, similar to the first method, the constituent materials of the first electrode 30 and the second electrode 40 become the same.

As a third preferable method of realizing $\rho_B<\rho_A$, a method may be exemplified in which different types of binder resins are used between the conductive pastes A and B. More specifically, a case in which binder resins having different compositions are used for the conductive pastes A and B, or a case where binder resins in which the compositions cannot be distinguished, but the molecular weights differ from each other, may be exemplified. In the latter case, a binder resin with a smaller molecular weight is used for the conductive paste B. With this method, the first electrode 30 and the second electrode 40 would have different constituent materials.

As another method of realizing $\rho_B<\rho_A$, a method may be exemplified in which different types of conductive fillers are used between the conductive pastes A and B. Alternatively, the contents of the conductive filler may differ between the conductive pastes A and B. With this method, the first electrode 30 and the second electrode 40 would have different constituent materials. Alternatively, the above-described methods may be combined to realize $\rho_B<\rho_A$.

Figure 6:
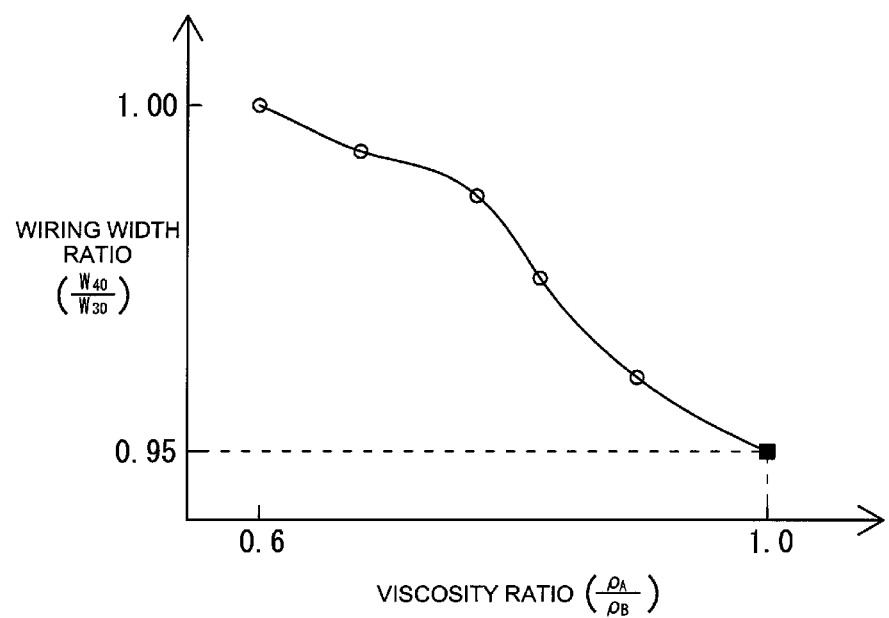
FIG. 6 is a diagram showing a relationship between a viscosity ratio of the first conductive paste and the second conductive paste and a wiring width ratio of the first electrode and the second electrode.

FIG. 6 is a diagram showing a relationship between a viscosity ratio ($\rho_B/\rho_A$) of the conductive paste A having the viscosity of $\rho_A$ and the conductive paste B having the viscosity of $\rho_B$, and a wiring width ratio ($W_{40}/W_{30}$) of the first electrode 30 having a wiring width of $W_{30}$ and the second electrode 40 having a wiring width of $W_{40}$. A ■ (solid square) in FIG. 6 shows a case when $\rho_B/\rho_A=1.0$, that is, a case of the related art process in which the same conductive paste is used between the processes of S11 and S12. The relationship shown in FIG. 6 is derived while setting the same conditions except for the condition that the conductive pastes having different viscosities from each other are used. This relationship also approximately applies when the other conditions are changed in a range where the screen printing is possible.

In the case of the related art process where $\rho_B/\rho_A=1.0$, in the process of S12, the time from the contact of the screen plate 61 on the back surface to the separation therefrom tends to become longer than the process of S11, and there may be cases where the plate separation is not smoothly achieved. One reason for this is that when the screen plate 51 is pressed by the squeezee 50 and contacts the back surface, the conductive paste B filled in the opening 64 ties the plate over the back surface (refer to FIG. 5). Because the number of openings 64 is larger than that of the opening 54, the force tying the plate is larger on the back surface side. When the plate separation is delayed, the time where the conductive paste B contacts the wall surface or the like of the opening 64 becomes longer, and adhesion tends to occur more easily, and the conductive paste B tends to more easily remain on the plate. Because of this, disconnection of the second electrode 40 caused by the conductive paste B being not transferred tends to occur more easily compared to the process of S11. Therefore, in the present electrode formation process, as described above, the conductive paste B used in the process of S12 is set to have a lower viscosity than that of the conductive paste A used in the process of S11.

As shown in FIG. 6, as $\rho_B/\rho_A$ becomes smaller, $W_{40}/W_{30}$ becomes larger. In other words, as $\rho_B$ is reduced, the wiring width of the second electrode 40 becomes wider. For example, when $\rho_B/\rho_A$ is set to about 0.6, $W_{40}$ becomes approximately the same width as $W_{30}$, whereas in the case of $\rho_B/\rho_A=1.0$, $W_{40}$ is about 5% narrower than $W_{30}$. There is also a tendency that, as $\rho_B$ is reduced, the disconnection of the second electrode 40 is less likely to occur. A primary reason for this is that because $\rho_B$ is set lower, the conductive paste B becomes more easily spread over the back surface and the electrode width $W_{40}$ becomes wider, and the contact area between the conductive paste B and the back surface is set larger. A reason why the conductive paste B remains in the opening 64 is that the adhesion force between the conductive paste B and the plate is stronger than the adhesion force between the conductive paste B and the back surface. However, in the present process, the contact area between the conductive paste B and the back surface is increased, and the latter adhesion force becomes stronger, resulting in inhibition of disconnection of the second electrode 40.

As described, in the present process, the second electrode 40 of a larger area than the first electrode 30 is formed by screen printing of the conductive paste B having a lower viscosity than the conductive past A. In other words, with the use of the conductive paste of appropriate viscosity corresponding to the electrode area, reduction of the amount of discharge of the conductive paste and the occurrence of the disconnection which tend to occur when an electrode of a large area is formed are inhibited.

The solar cell 10 manufactured through such a process does not have a defect such as the disconnection, and has an electrode formed in a target form. In addition, in the present process, because the amount of the conductive paste B taken away by the screen plate 61 is reduced, the second electrode 40 having a smaller surface unevenness and a flat surface may be formed.

EXPLANATION OF REFERENCE NUMERALS

10 SOLAR CELL; 20 PHOTOELECTRIC CONVERSION UNIT; 21 SUBSTRATE; 22, 23 AMORPHOUS SEMICONDUCTOR LAYER; 24, 25 TRANSPARENT CONDUCTIVE LAYER; 30 FIRST ELECTRODE; 31, 41 FINGER SECTION; 32, 42 BUS BAR SECTION; 40 SECOND ELECTRODE; 50 SQUEEZEE; 51, 61 SCREEN PLATE; 52, 62 MESH; 53, 63 MASK MEMBER; 54, 64 OPENING; A, B $A_{30}$, $B_{40}$ CONDUCTIVE PASTE.

The invention claimed is:

1. A method of manufacturing a solar cell, comprising:
   forming a first electrode over one surface of a photoelectric conversion unit by screen printing of a first conductive paste; and
   forming a second electrode having a larger area than that of the first electrode over the other surface of the photoelectric conversion unit by screen printing of a second conductive paste having a lower viscosity than that of the first conductive paste,
   wherein each of the first conductive paste and the second conductive paste contains a conductive filler, a binder resin, and an solvent,
   at least one of a type and a content for at least one of the binder resin and the solvent differs between the first conductive paste and the second conductive paste, the first electrode comprises a plurality of first finger sections arranged in parallel to each other and the second electrode comprises a plurality of second finger sections arranged in parallel to each other, more of the second finger sections being provided than the first finger sections, the first conductive paste and the second conductive paste are cured by heating to form the first electrode and the second electrode such that the conductive filler is dispersed in the binder resin, the first conductive paste includes the binder resin which is not yet cured in the form of a solid which can dissolve in the solvent or in the form of liquid or paste at room temperature, and the second conductive paste includes the binder resin which is not yet cured in the form of a solid which can dissolve in the solvent or in the form of liquid or paste at room temperature;

the conductive filler of the first conductive paste and the conductive filler of the second conductive paste are a same type of conductive filler.

2. The method of manufacturing the solar cell according to claim 1, wherein
a content of the solvent of the second conductive paste is larger than a content of the solvent of the first conductive paste.

3. The method of manufacturing the solar cell according to claim 1, wherein
the solvent of the first conductive paste is a first solvent, and
the solvent of the second conductive paste is a second solvent of a different type than the first solvent.

4. The method of manufacturing the solar cell according to claim 1, wherein
the first conductive paste contains a first binder resin as the binder resin, and
the second conductive paste contains, as the binder resin, a second binder resin of a different type to the first binder resin.

5. The method of manufacturing the solar cell according to claim 1, wherein
the viscosity of the second conductive paste is set lower as an area of the second electrode becomes larger.

6. The method of manufacturing the solar cell according to claim 1, wherein
a photoelectric conversion unit is formed by forming an amorphous semiconductor layer on each of one surface and the other surface of a crystalline semiconductor substrate before forming the first electrode and the second electrode.

7. The method of manufacturing the solar cell according to claim 1, wherein
the forming of the first electrode and the second electrode comprises curing the first electrode and the second electrode by heating at 200° C. or lower.

8. The method of manufacturing the solar cell according to claim 1, wherein
the number of the finger sections of the second electrode is set to 2 times to 6 times the number of the finger sections of the first electrode.

9. The method of manufacturing the solar cell according to claim 1, wherein
the thickness of the second electrode is thinner than that of the first electrode.

10. The method of manufacturing the solar cell according to claim 9, wherein
the thickness of the second electrode is 5 µm to 60 µm.

11. The method of manufacturing the solar cell according to claim 1, further comprising forming the photoelectric conversion unit before forming the first electrode and the second electrode,
wherein the forming of the photoelectric conversion unit comprises forming a first transparent conductive layer on a light receiving surface, and forming a second transparent conductive layer on a back surface,
wherein in the forming of the first electrode, the first electrode is formed on the first transparent conductive layer, and
wherein in the forming of the second electrode, the second electrode is formed on the second transparent conductive layer.

* * * * *

UNITED STATES PATENT AND TRADEMARK OFFICE
CERTIFICATE OF CORRECTION

PATENT NO. : 9,755,088 B2
APPLICATION NO. : 14/623854
DATED : September 5, 2017
INVENTOR(S) : Satoshi Tohoda et al.

It is certified that error appears in the above-identified patent and that said Letters Patent is hereby corrected as shown below:

On the Title Page

Item no. (73), please delete "Sanyo Electric Co., Ltd., Osaka Japan," and insert --Panasonic Intellectual Property Management Co., Ltd., Osaka Japan--.

Signed and Sealed this
Ninth Day of July, 2019

Andrei Iancu
*Director of the United States Patent and Trademark Office*